(12) United States Patent
Singh et al.

(10) Patent No.: US 8,652,295 B2
(45) Date of Patent: Feb. 18, 2014

(54) CMP TOOL IMPLEMENTING CYCLIC SELF-LIMITING CM PROCESS

(71) Applicants: Sinmat, Inc., Gainesville, FL (US);
University of Florida Research Foundation, Inc., Gainesville, FL (US)

(72) Inventors: Rajiv Singh, Newberry, FL (US);
Deepika Singh, Newberry, FL (US);
Abhudaya Mishra, Gainesville, FL (US)

(73) Assignee: Sinmat, Inc., Gainesville, FL (US)

( * ) Notice: Subject to any disclaimer, the term of this patent is extended or adjusted under 35 U.S.C. 154(b) by 0 days.

(21) Appl. No.: 13/932,724

(22) Filed: Jul. 1, 2013

(65) Prior Publication Data

US 2014/0000808 A1    Jan. 2, 2014

Related U.S. Application Data

(62) Division of application No. 12/761,110, filed on Apr. 15, 2010, now Pat. No. 8,506,835.

(60) Provisional application No. 61/169,551, filed on Apr. 15, 2009.

(51) Int. Cl.
*C23F 1/00* (2006.01)
*H01L 21/306* (2006.01)

(52) U.S. Cl.
USPC ......... 156/345.12; 216/89; 438/692; 438/693

(58) Field of Classification Search
USPC ................ 156/345.12; 216/89; 438/692, 693
See application file for complete search history.

(56) References Cited

U.S. PATENT DOCUMENTS

| 6,482,743 | B1 | 11/2002 | Sato |
| 7,258,598 | B2 | 8/2007 | Iwasaki et al. |
| 2003/0159362 | A1 | 8/2003 | Singh et al. |
| 2003/0162399 | A1 | 8/2003 | Singh |
| 2004/0043702 | A1 | 3/2004 | Singh |
| 2005/0075052 | A1 | 4/2005 | Kim et al. |

FOREIGN PATENT DOCUMENTS

KR   20070098321   10/2007

*Primary Examiner* — Roberts Culbert
(74) *Attorney, Agent, or Firm* — Jetter & Associates, P.A.

(57) ABSTRACT

A chemical mechanical polishing (CMP) apparatus includes a process controller operable to execute a multi-step CMP algorithm implementing delivering a first chemical composition onto the wafer surface while on a platen for a first time duration, and without removing the wafer from the platen, delivering a second chemical composition different from the first chemical composition onto the wafer surface for a second time duration. CMP is performed with a polishing pad contacting the wafer surface using a slurry including the first chemical composition during the first time duration or the second chemical composition during the second time duration, and a non-polishing process without any contact of the polishing pad to the wafer surface using the other of the first and second chemical composition during the other of the time durations, and repeating the multi-step CMP comprising process a plurality of times on the wafer.

14 Claims, 5 Drawing Sheets

CMP TOOL IMPLEMENTING CYCLIC SELF-LIMITING CM PROCESS

CROSS REFERENCE TO RELATED APPLICATIONS

This application is a divisional application of U.S. Non-Provisional patent application Ser. No. 12/761,110 filed Apr. 15, 2010, entitled "CYCLIC SELF-LIMITING CMP REMOVAL AND ASSOCIATED PROCESSING TOOL" which claims the benefit of Provisional Application Ser. No. 61/169,551 entitled "CYCLIC SELF-LIMITING CMP REMOVAL AND ASSOCIATED PROCESSING TOOL", filed Apr. 15, 2009, which are both herein incorporated by reference in their entirety.

STATEMENT REGARDING FEDERALLY SPONSORED RESEARCH

The subject invention was made with U.S. government support under PII No. 70NANB7H7008 with the NIST Advanced Technology Program (ATP or NIST ATP) (U.S. Department of Commerce, National Institute of Standards and Technology). The U.S. Government has certain rights in this invention.

FIELD

Embodiments of the invention relate to chemical mechanical polishing (CMP) apparatus for polishing integrated circuits (ICs).

BACKGROUND

The semiconductor device industry is continually driven to improve performance (e.g., faster chip speeds) and lower manufacturing costs. With a decrease in the feature size, the RC interconnect delay of an IC increases non-linearly and is generally much larger than the delay in switching the transistors (i.e., the gate delay). To counter the adverse effects of the RC delay and reduce manufacturing costs, new design techniques with higher levels of sophistication, new materials, and new interconnect manufacturing techniques have been introduced. A conventional interconnect design scheme is multilevel metallization, which span several planes and are isolated from one another by dielectric layers. To further reduce the RC delay, processes are moving towards dielectrics that have a dielectric constant lower than that of silica (k=3.9 to 4.0), generally referred to as low-k dielectrics. One class of low-k dielectrics is ultra low-k (ULK) dielectrics, generally defined herein as having a k value <2.7, such as porous carbon doped oxide, porous polymeric and certain silica based materials. Such ULK materials are known to be quite fragile and subject to scratching.

Low-k and ULK materials are typically much softer than traditional silica based dielectrics. As the dielectric constant is lowered, both the hardness and Young's modulus decrease significantly. When abrasives such as silica and alumina are used in CMP processes, they tend to scratch the soft surface, creating defects which can ultimately cause electrical shorts. Traditional CMP processes also introduce high frictional and shear forces on the surface. The poor adhesion of low-k films may also lead to delamination under conventional CMP conditions.

In the past decade, CMP has emerged as the fastest growing operation in the semiconductor manufacturing industry, and is expected to show fast growth in the future due to the introduction of copper/low dielectric constant (low-k and ULK) interconnects. An ideal CMP process should provide low defectivity, high planarity and a large, robust processing window. In the near future, CMP technology is expected to encounter two very significant hurdles related to scale-up from the current 300 mm wafer size to a 450 mm wafer size that is expected to occur and integration of fragile materials such as ULK dielectrics. Of all semiconductor processes (e.g., film deposition, thermal treatment etc.), the planarization technology is perhaps the most ill-equipped to make the transition to larger wafers. This is due to the extremely large number of processing variables (typically >20) that affect the uniformity across the wafers and defectivity obtained from the polishing process. Even the use of sophisticated sensing and control technologies may not be able to overcome the inherent fundamental deficiencies of conventional CMP processes described below.

Conventional CMP processes can be characterized as providing an "analog" response. The removal rate is dependent on a large number of process variables. The fundamental equation describing material removal is based on Preston's Law which states that the removal rate (RR) is directly proportional to applied pressure (P) and relative velocity (V) of slurry particles across the wafer surface.

$$RR = K_p(PV) \qquad (1)$$

where, $K_p$ is Preston's constant. Although from the above equation it appears that there are only two variables, in actual practice there are more than 20 significant process variables, such as variables related to the slurry chemistry, substrate characteristics (e.g., edge effects and wafer bow), tool variables (e.g., pressure, linear velocity and vibration) and pad characteristics (e.g., mechanical properties, topology, and slurry/effluent transport). These variables are expected to be amplified for larger wafers (e.g. 400 to 450 mm wafers), making engineering solutions even more challenging.

Moreover, there are fundamental limitations in achieving high planarity patterned structures. In conventional CMP processes, significant deviation in planarity occurs when two dissimilar materials (e.g. Cu/low-k dielectrics) are simultaneously polished. Due to differences in rate of polishing of the metal and the dielectric, two common non-planarity defects occur, termed dishing and erosion. The large variations in local polishing rates due to pattern effects and polishing rate selectivity between metal and dielectric makes it difficult to minimize dishing and erosion. Furthermore, the large range of these non-planarities substantially decreases the process window for robust manufacturing. Such issues are expected to be amplified when larger wafers are polished. Thus the inherent "analog" characteristics of the CMP process may place fundamental limitation to the local planarity that can be achieved in a manufacturing environment.

SUMMARY

As described in the background above, conventional CMP technology is generally ill-equipped to process low-k and ULK dielectrics as well as generally make the transition to process larger wafers (e.g. 400 to 450 mm wafers, or more), due to the extremely large number of processing variables (typically >20) that affect the uniformity across the wafer and defectivity obtained from the process. Embodiments of the invention provide CMP apparatus operable to implement a new CMP process that has a reduced set of variables that minimizes processing challenges associated with scaling up to process larger wafer sizes, which has also been found to significantly reduce induced defectivity.

One disclosed embodiment is a cyclic method of CMP of a wafer having a surface includes placing the wafer on a platen in a CMP apparatus and then performing a multi-step CMP comprising process. The CMP process includes delivering a first chemical composition onto the surface of the wafer while on the platen for a first time duration, and without removing the wafer from the platen, delivering a second chemical composition different from the first composition onto the surface of the wafer for a second time duration after the first time duration. The CMP comprising process includes CMP removal using a slurry during one of the first and second time durations and a non-polishing process without any contact of the polishing pad to the surface of the wafer during the other of the first and second time durations. The CMP comprising process is repeated a plurality of times on the wafer.

A CMP apparatus for implementing embodiments of the invention is also disclosed. The CMP apparatus includes a process controller operable to execute a multi-step CMP algorithm implementing delivering a first chemical composition onto the wafer surface while on a platen for a first time duration, and without removing the wafer from the platen, delivering a second chemical composition different from the first chemical composition onto the wafer surface for a second time duration. CMP is performed with a polishing pad contacting the wafer surface using a slurry including the first chemical composition during the first time duration or the second chemical composition during the second time duration, and a non-polishing process without any contact of the polishing pad to the wafer surface using the other of the first and second chemical composition during the other of the time durations, and repeating the multi-step CMP process a plurality of times on the wafer.

BRIEF DESCRIPTION OF THE DRAWINGS

FIG. 1A shows a schematic diagram for a cyclic CMP process according to embodiments of the invention shown as DCMP (for "digital" CMP), while

DETAILED DESCRIPTION

Figure 1A:
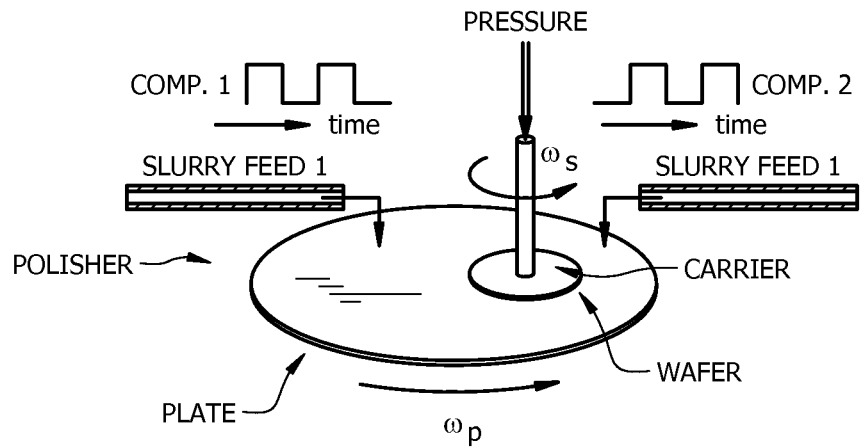

Embodiments of the invention are described with reference to the attached figures, wherein like reference numerals are used throughout the figures to designate similar or equivalent elements. The figures are not drawn to scale and they are provided merely to illustrate certain features. Several aspects of this Disclosure are described below with reference to example applications for illustration. It should be understood that numerous specific details, relationships, and methods are set forth to provide a full understanding of the subject matter in this Disclosure. One having ordinary skill in the relevant art, however, will readily recognize that embodiments of the invention can be practiced without one or more of the specific details or with other methods. In other instances, well-known structures or operations are not shown in detail to avoid obscuring subject matter. Embodiments of the invention are not limited by the illustrated ordering of acts or events, as some acts may occur in different orders and/or concurrently with other acts or events. Furthermore, not all illustrated acts or events are required to implement a methodology in accordance with this Disclosure.

One disclosed embodiment is a cyclic method for CMP of a wafer having a surface including placing the wafer on a platen in a CMP apparatus, and performing a multi-step CMP comprising process. The multi-step process comprises the steps of delivering a first chemical composition onto the surface of the wafer while on the platen for a first time duration, and without removing the wafer from the platen, delivering a second chemical composition different from the first composition onto the surface of the wafer for a second time duration after the first time duration. The CMP comprising process comprises CMP removal using a slurry during one of the first and the second time durations and a non-polishing process without any contact of the polishing pad to the surface of the wafer during the other of the first and second time durations. The CMP comprising process is generally repeated a plurality of times on the wafer.

Cyclic CPM methods according to embodiments of the invention generally overcome the fundamental challenges described in the background above. Although embodiments of the invention are generally described herein as based on two (2) different compositions applied at different times, the multi-step process can include more than two (2) compositionally different steps, such as a third composition during a third time duration occurring after the second time duration. In one embodiment, the third composition comprises deionized (DI) water in some predetermined pH range, which can be used for rinsing the wafer.

Cyclic methods according to embodiments of the invention generally result in a fixed removal of wafer surface material for each cycle, the removal rate being largely independent of the variables inherent in conventional CMP processing, such as pressure and velocity. Each cycle generally removes only a portion of the layer/layers to be removed. Cyclic CMP methods according to embodiments of the invention are well suited for scale-up in wafer size, such as to at least 450 mm wafers. It should be noted that cyclic CMP methods according to embodiments of the invention are similar to Atomic Layer Deposition (ALD) methods in that both methods are based on cyclic repeatable flows and self-limiting reactions to achieve controlled removal, where ALD provides self-limiting growth of materials.

In one embodiment of the invention the wafer surface comprises a metal (e.g. copper) surface and the first chemical composition includes at least one chemical component that reacts with the metal surface to form a reacted layer. The polishing pad can be in contact with the wafer or not be in contact with the wafer to form the reacted layer. The reacted layer is generally substantially insoluble in the slurry. The CMP removal removes the reacted layer during the second time duration. In certain embodiments, the reacted layer is softer as compared to the metal surface. This is in contrast to conventional CMP processes which form copper oxide (using an oxidizer such as hydrogen peroxide) which has a hardness that is greater than copper (2.5 to 3 on the Mohs scale). In one embodiment the metal surface can comprise copper. The chemical component that reacts with the metal surface can be an oxidizer, such as iodine ($I_2$), bromine ($Br_2$), fluorine ($F_2$), HI, $KIO_3$, sulfuric acid, hydrochloric acid or carbonic acid. These chemicals are generally added in the concentration range of from about 0.1 mM to 1 M. The reactive chemical component may be formed either directly or indirectly using appropriate chemicals. In embodiments of the invention the reacted layer can comprise a metal halide, such as copper iodide (CuI).

In one particular embodiment, in the case of copper metallization, an iodine based chemistry which forms soft iodide layers can be used. As the copper iodide layer is soft it can be gently removed by soft particles. In the case of barrier materials such as tantalum, a thin easily removable iodide/hydroxide complex can be formed.

As used herein, the term "soft particles" refers to particles having a hardness less than the film being polished, such as a metal film (e.g. copper or copper comprising film). If the hardness of the particles is less than the metal film, scratches generally do not occur on the wafer surface independent of the concentration of particles in the slurry. Examples of particles which are typically softer than metals such as copper and most applicable dielectric materials include polymer particles such as polystyrene, polytetrafluoroethylene and polyamide, metal particles such as nickel, carbon, silver and copper and inorganic particles such as porous silica.

When the soft layer formed on the metal surface from reaction with the slurry solution has a hardness less the metal film, it is generally easily removable from the surface when mechanical abrasion is applied during the polishing process. Mechanical abrasion can be provided either with or without particles in the slurry. When the slurry is particle-free, the polymeric polishing pad provides the necessary mechanical abrasion when it rubs against the wafer surface.

The concentration range for the soft particles can vary from 0.01 to 50 wt. %, depending on the ability of the particles to disperse in the particular slurry solution. In one embodiment the soft particle concentration is generally between 1% to 10 wt. %. The size of the soft particles can vary from 0.1 μm to 100 μm. In one embodiment the soft particle size is from 0.1 μm 50 μm. The particles can be composite particles formed from one or a plurality of polymers. Alternatively, the particles can be in the form of a mixture.

The slurry particles can be soft nanoporous silica particles. It is expected that nano-porous materials can be expected to meet the hardness criteria of being softer than the metal, such as a copper or a silver film. A nanoporous material is a material which has a high fraction of porous spaces. The pore size can vary from about 0.2 nm to 100 nm. Pores generally occupy greater than 10% of the material. The nanopores can provide a hardness reduction by more than factor of three (3) compared to non-porous particles.

In another embodiment of the invention the surface comprises a dielectric surface and the first chemical composition includes at least one surfactant or surface active polymer, wherein the CMP removal occurs during the first time duration. During the first time duration the surfactant or surface active polymer forms a surface passivation layer (e.g., via adsorption) on the dielectric surface. The polishing pad can be in contact with the wafer or not be in contact with the wafer to form the passivation layer. Upon formation of the surface passivation layer on the dielectric surface a removal rate of the CMP is reduced, and can be essentially stopped. In this embodiment the non-polishing process during the second time duration without any contact of the polishing pad to the surface of the wafer comprises removing the surface passivation layer. The dielectric surface can comprises a low-k dielectric, such as a ULK dielectric.

Figure 1B:
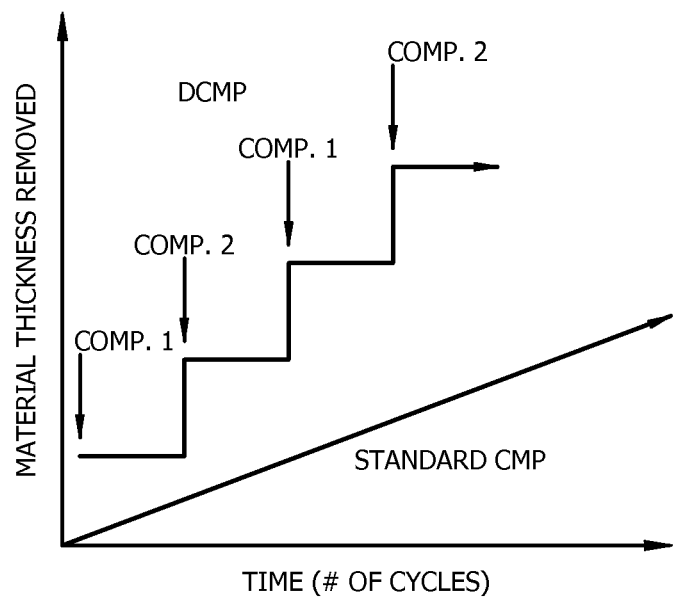
FIG. 1B shows the removal rate as a function of time for a cyclic CMP process according to embodiments of the invention as compared to a conventional CMP process.

A schematic diagram of an exemplary cyclic process according to embodiments of the invention is shown in FIG. 1A. In cyclic CMP methods according to embodiments of the invention, the slurry is separated into two (or more) components which are fed sequentially (component 1 (shown as "COMP. 1" by "SLURRY FEED 1"), component 2 (shown as "COMP. 2" by "SLURRY FEED 2"), component 1, component 2, etc.) onto the plate of the polisher. By providing one or more components that initiate a self-limiting reaction the thickness of the material removed per cycle becomes substantially equal to the thickness of the reacted layer (for metals), or proportional to the adsorption rate of the surfactant or surface active polymer (for dielectrics). Thus, a controlled amount of material from the wafer surface can be removed per slurry cycle as depicted for the process identified as "DCMP" in FIG. 1B. In contrast, FIG. 1B also shows the conventional CMP process shown as "STANDARD CMP" having a linear removal response for comparison. Unlike the conventional linear CMP process such as STANDARD CMP, the removal rate (RR) for a cyclic CMP process according to the invention can be written as:

$$RR = n \cdot \Delta x \quad (2)$$

where, n=number of repeat cycles and "$\Delta x$" is the thickness of material removed per sequence, which can be essentially constant. The value of "$\Delta x$" generally depends on (1) chemistry of the slurry which can be used to control the thickness of the reacted layer in the case of metal removal or (2) surfactant adsorption rate for the removal of dielectric layers. Both these parameters are intrinsic properties of material-additive interactions and are generally not dependent on flow, or pressure or pad deviations during the polishing process.

Figure 2A:
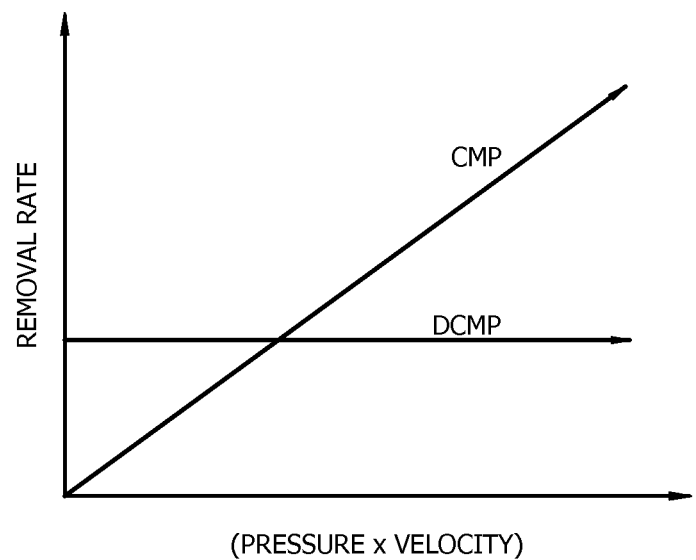
FIGS. 2A and B are depictions of the comparative removal rate for conventional CMP and cyclic CMP processes according to embodiments of the invention (shown as DCMP) as a function of pressure×velocity and pad roughness/local slurry flow rate, respectively.
Figure 2B:
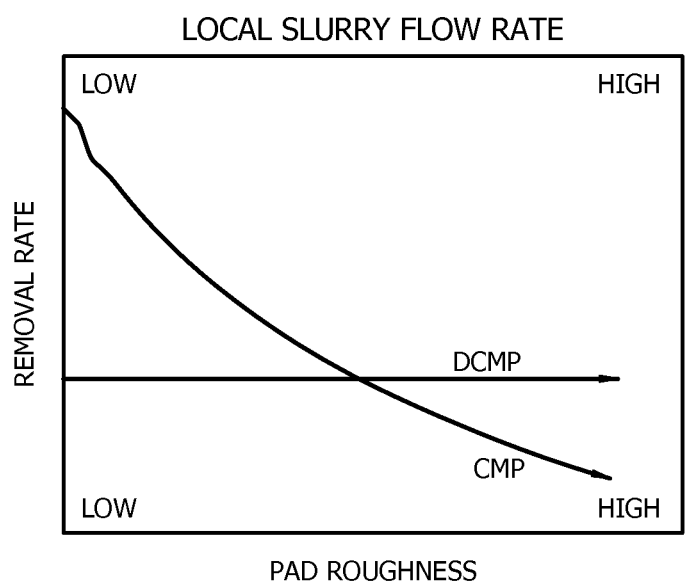

FIGS. 2A and B are depictions of the comparative removal rate for conventional CMP and cyclic CMP processes according to embodiments of the invention (shown as DCMP) versus Pressure×Velocity and Pad roughness/local slurry flow rate, respectively. Unlike conventional CMP processes, cyclic CMP processes according to embodiments of the invention are shown evidencing a constant removal rate for pressure×velocity, as well as for slurry flow rate and pad roughness.

Figure 3A:
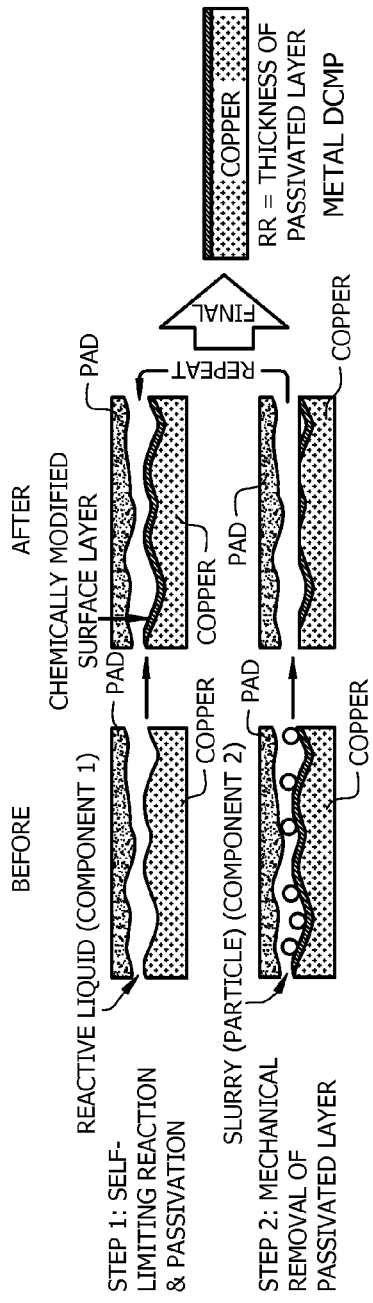
FIGS. 3A and B are depictions of cyclic CMP processes according to embodiments of the invention (shown as DCMP) for polishing metal and dielectric layers, respectively.

FIGS. 3A and B are depictions of cyclic CMP processes according to embodiments of the invention (shown as DCMP) for metal and dielectric polishing, respectively. As shown in FIG. 3A, in the case of a metal, a first chemical composition comprising component 1 is introduced which forms a thin passivating layer on the surface of the metal (i.e. copper). As this is generally a self limiting reaction, for a constant temperature, the thickness of the reacted "passivation" layer is determined by oxidizer/inhibitor composition. This thickness is expected to be substantially the same for all surfaces and independent of both component flow and time. Subsequently, a second chemical composition comprising the second component of the slurry is introduced which only removes the reacted layer (but does not remove an appreciable amount of metal, such as copper). Thus, the total thickness removed is substantially a constant that does not depend on tool/pad/flow variables. By repeating the sequence a plurality of times a controlled thickness can be removed.

The formation of a soft layer has been confirmed by nano indentation measurements. The soft layer formed on an exemplary copper surface using iodine was found to have a hardness of about 10 (ten) times lower than that of copper, while copper oxide (formed after addition of peroxide) is known to have a hardness of 4 (four) times higher than copper.

Figure 3B:
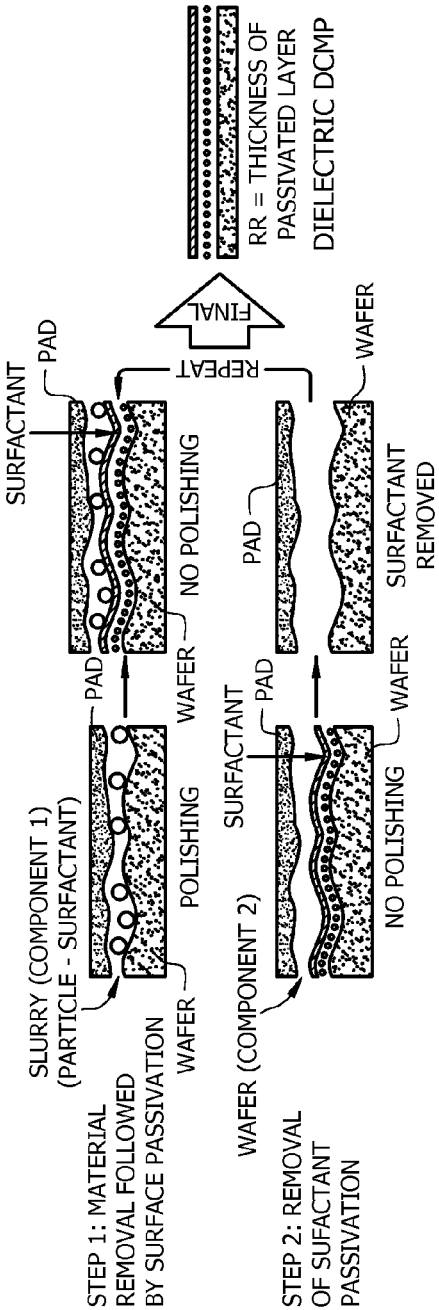

As shown in FIG. 3B, in case of a dielectric, adsorption of a surfactant or surface active polymer can create a self limiting step. In this case the CMP removal process generally only occurs before the surfactant or surface active polymer in the slurry has significantly adsorbed onto the dielectric surface. By removing the adsorbed surfactant layer, such as using DI water, the CMP removal process followed by the surfactant or surface active polymer stopping the removal can be repeated a plurality of times.

Table 1 below lists certain advantages for cyclic CMP methods according to embodiments of the invention (shown as DCMP) as compared to standard CMP processes.

TABLE 1

Comparison of cyclic CMP (DCMP) and standard CMP processes.

|  | DCMP | Standard CMP |
|---|---|---|
| Equipment requirement | Same | Same |
| Planarization Efficiency | Same | Same |
| Removal Mechanism | Digital | Analog |
| RR dependent on: |  |  |
| Flow parameters | No | Yes |
| Pad parameters | No | Yes |
| Tool parameters | No | Yes |
| Wafer parameters | No | Yes |
| Self-limiting Reaction | Yes | No |
| Removal Rates | Lower than CMP | Higher than DCMP |
| Non-uniformity Across the wafer: |  |  |
| Removal Rate | Minimal | High |
| Dishing | Minimal | High |
| Erosion | Minimal | High |
| Time Dependence | None | High |
| Wafer Bow Effects | Minimal | High |
| Edge Effects | Minimal | Significant |
| Defectivity | Lower | Higher |
| Scalable to 450 mm | Yes | Very Challenging |

Cyclic CMP processes according to embodiments of the invention generally provide low stress polishing. By using nanoporous particles which reduce the hardness of the particles, both the indent depth as well as the deformation of the substrate can be significantly decreased. In one embodiment the slurry particles are nanoparticles having a size of 50 to 500 nm, and a pore size primarily in the range from 2 to 100 nm. For example, a 200 nm 38% nanoporous silica (pore size 6 A particles), the hardness (measured by nano indentation) was found to decrease by a factor of 3 when the porosity is increased to 40%. Also the Hamaker constant was found to decrease by a factor of 2 at high porosity. The van der Waals attractive force between two surfaces is known to be linearly proportional to the Hamaker constant thus nanoporous particles are expected to have reduced adhesion (lower defectivity). Another method to reduce stress according to embodiments of the invention is to form a soft layer on the wafer surface as described above, such as from copper or other metal.

CMP according to embodiments of the invention is expected to be easily scalable to large wafers (e.g. 450 mm and beyond) and is generally gentle enough so as not to damage fragile ULK materials. This technology is expected to be a quantum leap from existing CMP processes. Some of the important features of this technology and its likely impact for the semiconductor industry are listed in Table 2 below.

TABLE 2

Comparison between present state-of-the-art CMP and a cyclic CMP process (DCMP)

| Features | State-of-the-art | DCMP | Customer Impact |
|---|---|---|---|
| Nature of material removal | Analog | Digital | Robust Manufacturing, Higher Yield, & Scalable to 450 mm wafers |
| Removal rate Non-uniformity | High | Minimal | Increased Yield |
| Edge Effects | High | Minimal | Increased Yield |
| Surface Planarity | Low | High | Increased Yield |
| Down pressure | >2 psi | 1-2 psi | Lower defect rate |
| Soft Nanoporous particles | No | Yes | Lower defect rate |
| Throughput (wafers/hour) | ~15 | ~15 | No change |
| Ultra Low k compatibility | Good | Excellent | Higher Yield & Scalable |
| Equipment Requirement | Same | Same | No Change |

Figure 4:
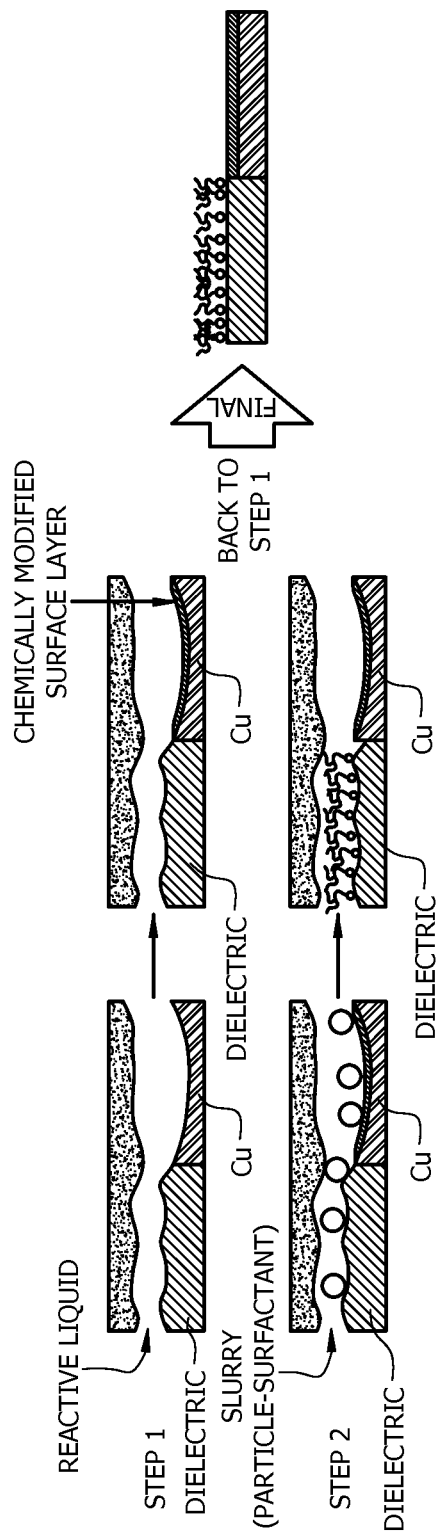
FIG. 4 is a schematic diagram of a cyclic CMP method according to another embodiment of the invention for polishing patterned wafers.

Cyclic CMP methods according to embodiments of the invention may be slightly modified from the blanket processes described above for the polishing of certain patterned wafers. A schematic diagram of an exemplary cyclic two step method according to an embodiment of the invention for patterned wafers is shown in FIG. 4. Wafers generally become metal comprising patterned wafers when trenches are cut in the dielectric (e.g. ULK) at each metal interconnect level. An interconnect metal such as copper is deposited on the wafer which fills the trenches and also provides metal on the raised dielectric surfaces as well. In step 1 shown in FIG. 4, a first reactive liquid forms a chemically modified (e.g. oxidized) surface layer, such as copper iodide. In step 2, CMP is performed with a slurry comprising a surfactant or a surface active polymer, and generally slurry particles. Dielectric is removed until the surfactant layer forms on the surface of the dielectric. The chemically modified surface layer on the metal is also simultaneously removed in step 2 by the same slurry. By then removing the surfactant layer which forms on the dielectric surface, the cyclic process (step 1 then step 2, etc.) can be repeated until the surface is planarized sufficiently. The final endpoint for indicating a sufficiently planarized structure can be determined in a number of ways, including by the number of cycles by assuming a fixed removal per cycle.

In some applications, a tantalum or other barrier metal layer may be on top of the dielectric. This may be the case because of high selectivity in the earlier polishing step. In this case, three steps may be used. The first step uses a first slurry which provides a high removal rate for Ta and removes the dielectric by methods described above. The second step can be a reactive liquid for chemically modifying (e.g. oxidizing) the interconnect metal layer. The third step comprises a second slurry which is a high Ta removal slurry and also removes the interconnect metal (e.g. copper) by the method described above for copper. By alternating these three slurries, uniform removal across the wafer can be achieved.

Figure 5:
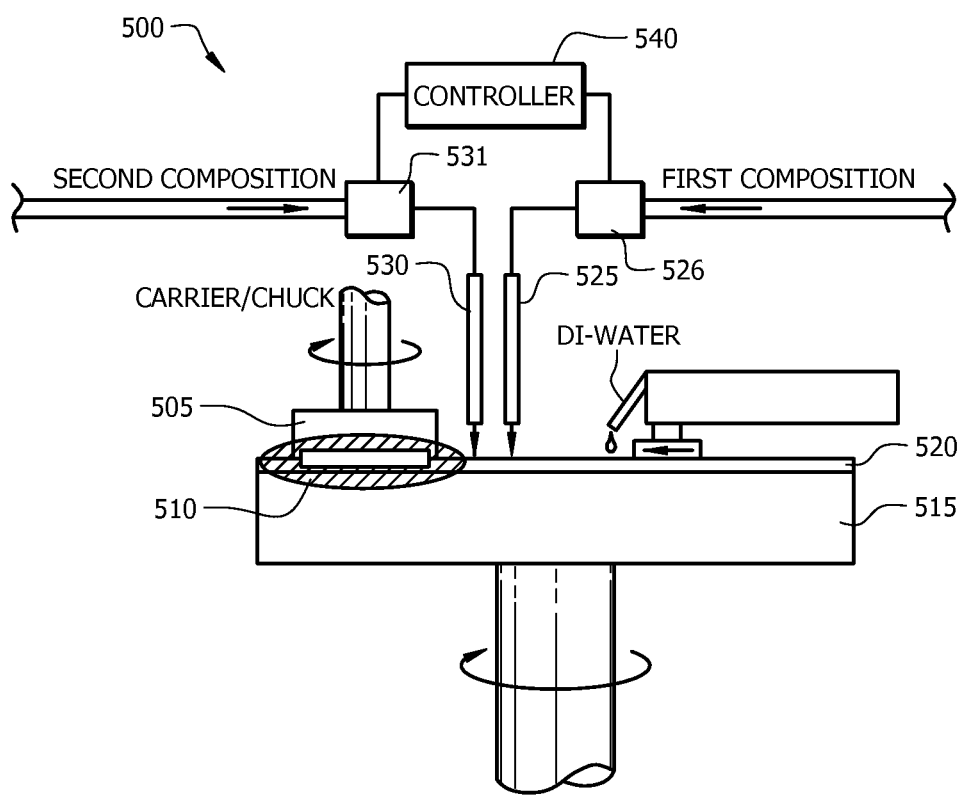
FIG. 5 is a simplified depiction of a CMP apparatus according to an embodiment of the invention comprising a process controller communicably coupled to control first and second control valves operable to implement a CMP comprising process comprising CMP removal using a slurry during a first time duration and a non-polishing process during another time duration, and repeating the CMP comprising process a plurality of times on the wafer.

FIG. 5 is a simplified depiction of a CMP apparatus 500 including a process controller 540 operable to execute a disclosed multi-step CMP algorithm implementing delivering a first chemical composition onto the surface of a wafer 510 while on a platen 515 for a first time duration, and without removing the wafer from the platen, delivering a second chemical composition different from the first chemical composition onto the wafer surface for a second time duration, according to an embodiment of the invention. Apparatus 500 includes a polishing head 505 for holding the wafer 510, and a polishing pad 520 on the platen 515 operable to polish the surface of the wafer 510. The process controller (e.g. microprocessor or microcontroller) 540 is communicably coupled to the first and second control valves 526, 531 and is operable to implement a disclosed multi-step CMP process including CMP removal using a slurry during one of the first and second time durations and a non-polishing process without any contact of the polishing pad 520 to the surface of the wafer 510 during the other of the first and second time durations and without removing the wafer 510 from the platen 515.

A first inlet 525 including at least one control valve 526 is for delivering a first slurry composition when commanded by the process controller 540 during the first time duration onto a surface of the wafer 510. A second inlet 530 including at least a second control valve 531 is for delivering a second slurry composition different from the first composition when commanded by the process controller 540 without removing the wafer 510 from the platen 515 during the second time duration after the first time duration onto the surface of the wafer 510. The multi-step CMP algorithm is operable when executed by the process controller 540 to implement repeating the CMP comprising process a plurality of times on the wafer, such as to realize the cyclic DCMP removal rate as a function of time described above relative to FIG. 1B.

While various embodiments of the invention have been described above, it should be understood that they have been presented by way of example only, and not limitation. Numerous changes to the disclosed embodiments can be made in accordance with this Disclosure without departing from the spirit or scope of the subject matter disclosed herein. Thus, the breadth and scope of this Disclosure should not be limited by any of the above described embodiments. Rather, the scope of this Disclosure should be defined in accordance with the following claims and their equivalents.

Although this Disclosure has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including," "includes," "having," "has," "with," or variants thereof are used in either the detailed description and/or the claims, such terms are intended to be inclusive in a manner similar to the term "comprising."

The invention claimed is:

1. A chemical mechanical polishing (CMP) apparatus, comprising:
a polishing head for holding a wafer, a platen, and a polishing pad on said platen;
a first inlet including a first control valve for delivering a first composition when commanded by a process controller during a first time duration onto a surface of said wafer, and
a second inlet including a second control valve for delivering a second composition different from said first composition when commanded by said process controller during a second time duration after said first time duration onto said surface of said wafer,
said process controller communicably coupled to control said first and said second control valves, and executing a multi-step CMP algorithm that implements a multi-step CMP comprising process including:
delivering a first chemical composition onto said surface of said wafer while on said platen for a first time duration, and
without removing said wafer from said platen, delivering a second chemical composition different from said first chemical composition onto said surface of said wafer for a second time duration after said first time duration,
performing a CMP removal process with contact of said polishing pad to said surface of said wafer using a slurry including said first chemical composition during said first time duration or said second chemical composition during said second time duration, and a non-polishing process without any contact of said polishing pad to said surface of said wafer using the other of said first chemical composition and said second chemical composition during the other of said first and said second time durations, and
repeating said multi-step CMP comprising process a plurality of times on said wafer.

2. The apparatus of claim 1, wherein said surface of said wafer comprises a metal surface and said first chemical composition includes at least one chemical component that reacts with said metal surface to form a reacted layer, further wherein said CMP removal process removes said reacted layer during said second time duration.

3. The apparatus of claim 2, wherein said reacted layer is softer as compared to said metal surface.

4. The apparatus of claim 2, wherein said metal surface comprises copper.

5. The apparatus of claim 2, wherein said reacted layer comprises a metal halide.

6. The apparatus of claim 5, wherein said metal halide comprises copper iodide (CuI).

7. The apparatus of claim 1, wherein said surface of said wafer comprises a dielectric surface and said first chemical composition includes at least one surfactant or surface active polymer, said CMP removal process occurring during said first time duration, said surfactant or surface active polymer forming a surface passivation layer on said dielectric surface, formation of said surface passivation layer on said dielectric surface reducing a removal rate of said CMP removal process, and wherein said non-polishing process comprises removing said surface passivation layer.

8. The apparatus of claim 7, wherein said dielectric surface comprises an ultra low-k (ULK) dielectric.

9. The apparatus of claim 7, wherein said surfactant is at least one selected from the group consisting of non-ionic, anionic, cationic and zwitterionic surfactants.

10. The apparatus of claim 7, wherein said first chemical composition includes said surface active polymer, and said surface active polymer comprises polyethylene oxide (PEO), polyacrylic acid (PAA), polyacryamide (PAM), polyvinylalcohol (PVA) or polyalkylamine (PAH).

11. The apparatus of claim 1, wherein said slurry comprises a plurality of soft particles, and wherein said soft particles are softer as compared to a hardness of copper.

12. The apparatus of claim 11, wherein said plurality of soft particles comprise polymer or nano-porous particles.

13. The apparatus of claim 11, wherein said plurality of soft particles comprise at least one selected from the group consisting of polystyrene, polytetrafluoroethylene, polyamide, silver and porous silica.

14. The apparatus of claim 1, wherein said plurality of times includes at least four (4) times.

* * * * *

UNITED STATES PATENT AND TRADEMARK OFFICE
CERTIFICATE OF CORRECTION

PATENT NO.        : 8,652,295 B2  
APPLICATION NO.   : 13/932724  
DATED             : February 18, 2014  
INVENTOR(S)       : Rajiv Singh, Deepika Singh and Abhudaya Mishra Page 1 of 1

It is certified that error appears in the above-identified patent and that said Letters Patent is hereby corrected as shown below:

On the Title Page, Item (54) and in the Specification, Column 1, Lines 1-2, please amend the title to read: CMP TOOL IMPLEMENTING CYCLIC SELF-LIMITING CMP PROCESS Signed and Sealed this
Twenty-seventh Day of May, 2014

Michelle K. Lee
*Deputy Director of the United States Patent and Trademark Office*